TRANSISTOR CONSTRUCTION

Filed June 16, 1954

INVENTORS
KENNETH F. STRIPP &
ARNOLD R. MOORE
BY J. L. Whittaker
ATTORNEY

United States Patent Office 2,874,083

Patented Feb. 17, 1959

2,874,083

TRANSISTOR CONSTRUCTION

Kenneth F. Stripp and Arnold R. Moore, Princeton, N. J., assignors to Radio Corporation of America, a corporation of Delaware Application June 16, 1954, Serial No. 437,158

6 Claims. (Cl. 148—33)

Figure 1:
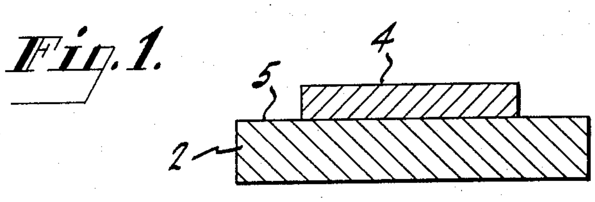

This invention relates to improved semi-conductor devices and more particularly to improved transistors of the alloy junction type.

A typical alloy junction triode transistor comprises a base wafer of a semi-conductive material such as germanium or silicon and two rectifying electrodes alloyed to opposite surfaces thereof. One of the electrodes is generally utilized as an emitter to inject minority electric charge carriers into the wafer. The other electrode is generally utilized as a collector to collect the charge carriers that are injected by the emitter. One of the measures of efficiency of such a transistor is the proportion of the injected charge carriers that are collected by the collector electrode. This efficiency may be expressed either as a function of the collector current divided by the emitter current, $\alpha_{ce}$, or as a function of the collector current divided by the base current, $\alpha_{cb}$, this latter function being referred to as the current gain of the transistor when utilized in a so-called grounded emitter circuit.

Diffusion is an important phenomenon in the operation of most transistor devices. In many transistors minority charge carriers injected by the emitter proceed through the base region between the electrodes principally by diffusion. In other transistors other effects such as field effects may be utilized to control the minority charge carrier flow, but the diffusion process is relatively important in the operation of all known transistor devices. The biasing potentials applied to the electrodes do not extend into the base region, and the base region is substantially free of any applied electric potential gradient or field. Since diffusion is a primary phenomenon in the transport of the critical charge carriers through the base region, the geometry of the base region and of the emitter and collector electrodes is relatively critical for optimum operation. For example, as described and claimed in the copending application of J. I. Pankove, Serial 293,330, filed June 13, 1952 assigned to the same assignee as the present application, it has been found that improved efficiency is provided by making the collector electrode substantially larger in area than the emitter electrode. It has also been established that the spacing between the two electrodes within the wafer is relatively critical and preferably should be made as small as possible without electrically short-circuiting the electrodes.

One object of the instant invention is to provide improved transistor devices.

Another object is to provide improved alloy type transistors having improved current gain characteristics.

Another object is to provide transistors of improved construction.

These and other objects are accomplished by the instant invention which provides a transistor device having an emitter electrode that penetrates into the semi-conductor base wafer of the device to a minimum depth. The penetration of the emitter is made as small as possible consistent with satisfactory charge carrier injection and may be as small as a few microns. The interior spacing between the emitter and collector electrodes is maintained at its optimum value by providing a deeper penetration of the collector electrode into the wafer instead of reducing the wafer thickness, thus improving the electrical characteristics of the device without sacrificing its physical strength or ruggedness.

Figure 2:
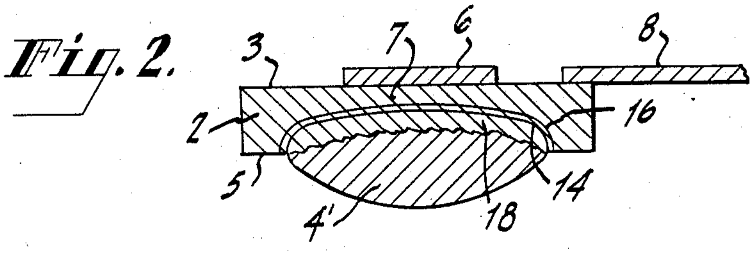
Figure 3:
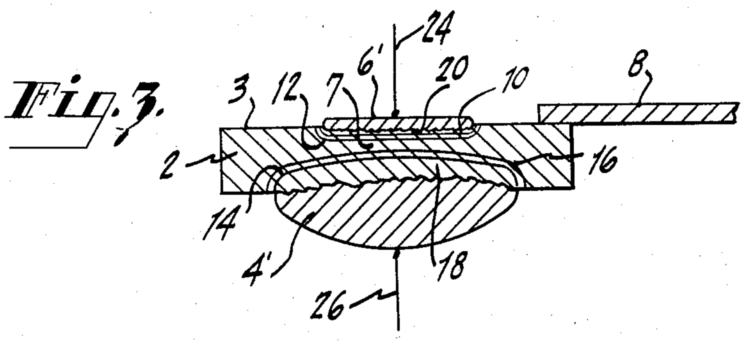

The invention will be explained in greater detail in connection with the accompanying drawing of which:

Figures 1–3 are schematic, cross-sectional, elevational views illustrating successive steps in the manufacture of a transistor according to the instant invention.

Similar reference characters are applied to similar elements throughout the drawing.

Referring now to Figure 1, a transistor device according to a preferred embodiment of the invention may be made as follows: A wafer 2 of n-type semi-conductive germanium having a resistivity of about 1 ohm-cm. is prepared in the usual manner. As initially cut from a relatively large single crystal of germanium the wafer may be about .125"x.085"x.01" thick. It is etched in a solution of hydrofluoric and nitric acids to reduce its thickness to about .005" and to expose a fresh, crystallographically undisturbed surface. A pellet 4 of indium is placed upon one surface 5 of the wafer. The pellet may be in the form of a disc about .045" in diameter and about .002" thick. The wafer and pellet are heated together in a non-oxidizing atmosphere such as hydrogen or argon at about 500° C. for about five minutes to alloy the pellet to the wafer to form a collector electrode 4' as shown in Figure 2.

During heating the indium dissolves a portion of the germanium and penetrates relatively deeply into the wafer, the surface of maximum penetration being referred to as the alloy front 14. The maximum depth of penetration of the indium may be increased by increasing the alloying temperature according to known principles. A p-n rectifying junction 16 is formed adjacent to the alloy front and separates the electrode electrically from the base region 7. As the device is cooled a portion of the dissolved germanium recrystallizes upon the wafer to form a recrystallized region 18. The balance of the electrode comprises principally indium and a small proportion of dissolved germanium.

A second indium pellet 6 is placed upon the surface 3 of the wafer opposite the collector electrode and coaxially aligned therewith. This pellet may be in the form of a disc about .015" in diameter and about .002" thick, and is coated with a film of indium chloride by immersing it in a solution of indium chloride. A tinned base tab 8 which may be of nickel is also placed upon the surface 3 of the wafer adjacent to the pellet 6. The entire device is heated in air at about 200° to 250° C. for a few seconds or longer to alloy the second pellet to the wafer and simultaneously to solder the base tab to the wafer. The resulting device is shown in Figure 3.

The indium chloride on the surface of the pellet acts as a flux to insure uniform wetting of the wafer surface by the pellet and permits surface alloying at a relatively low temperature. The solubility of germanium in indium at relatively low temperatures such as 200° C. is relatively small and the pellet 6, therefore, penetrates only slightly into the surface during the second alloy step. The alloy front 10 and the rectifying barrier 12 are substantially parallel to the surface 3 of the wafer over substantially their entire area since the electrode penetration may be restrained to less than 1 micron beneath the surface. The electrode may penetrate somewhat deeper than 1 micron but for optimum results is limited to a penetration of less than 10 microns. Electrical leads 24 and 26 may be attached to the electrodes and the device may be etched, mounted and potted according to conventional techniques.

Devices according to the invention, in which the emitter electrode penetrates to a minimum depth into the semiconductor wafer, exhibit improved electrical characteristics. In particular the current gain, $\alpha_{cb}$, is about twice that of previous similar devices in which the emitter electrodes penetrate relatively deeply.

Although the improvement resulting from the invention is unexpected and surprising its rationale may be simply stated on a qualitative basis in terms of diffusion effects. Minority charge carriers injected into the wafer around the periphery of the emitter diffuse not only toward the collector but also toward the surface of the wafer adjacent to the emitter. It has been previously established that due to surface energy level conditions minority charge carriers reaching the surface of a semi-conductor body readily and rapidly combine with majority charge carriers and disappear. This generally deleterious effect is called surface recombination and, when the transistor is utilized in a circuit, it contributes to the base current and reduces the value of $\alpha_{cb}$. Loss of minority charge carriers by recombination at the surface of the semiconductor is relatively much more important than recombination losses within the bulk of the material since the bulk recombination may be minimized by known techniques and reduced to a fraction of the surface recombination. The surface recombination creates a diffusion potential which tends to draw injected charge carriers toward the surface. In a similar manner when the collector electrode absorbs minority charge carriers it creates an opposing diffusion potential tending to draw the charge carriers toward the collector. When, as is found in prior art devices made heretofore the emitter electrode penetrates deeply into the wafer the collector electrode is disposed at a relatively great distance from the surface surrounding the emitter. In such prior art devices the diffusion potential gradient between the collector electrode and the periphery of the emitter electrode is relatively flat and the opposing gradient between the periphery of the emitter and the adjacent surface being relatively steep attracts a relatively large proportion of the injected minority carriers from the outer edges of the emitter.

In transistor devices according to the invention, on the other hand, the emitter penetrates relatively little into the wafer and the collector electrode is made to penetrate relatively deeply to provide substantially the same minimum internal spacing between the two electrodes as in previous devices. The collector electrode is thus placed relatively close to the wafer surface surrounding the emitter, and the diffusion potential gradient between the periphery of the emitter and the collector is greatly increased. Because of the increase in this gradient, fewer minority carriers injected from the periphery of the emitter diffuse toward the surface of the wafer and more diffuse toward the collector electrode.

The optimum construction according to this explanation would include an emitter electrode having no penetration into the wafer. Such an electrode may be formed by evaporating or electroplating a metallic film upon the surface of the wafer and is known as a surface barrier electrode. Known surface barrier electrodes, however, do not inject minority charge carriers into semi-conductor wafers as efficiently as do alloy junction or grown junction type electrodes. In most instances surface barrier electrodes are less satisfactory as emitters than electrodes that penetrate to some extent to form p-n rectifying junctions within the semi-conductor wafers.

It is believed that in previous alloy junction type transistors of the type in which the collector junctions have an area about 9 times as large as that of the emitter junctions, the collector electrodes penetrate about 3 to 9 times as deeply into the base wafers as do the emitter electrodes. This difference in penetration is apparently due principally to the difference in size between the two electrode pellets. In the alloy process the indium pellets tend to ball up because of surface tension before they wet and sink into the germanium surface. The change in shape of the pellets during alloying affects the shape of the alloy fronts and causes large pellets to penetrate more deeply than small pellets. The ratio of the penetrations of the two electrodes of previous alloy type transistors is believed to be approximately equal to the ratio of the diameters of the electrodes and does not exceed the ratio of their areas. A typical previous device having a base wafer about .005 inch thick may include a collector electrode about .045″ in diameter that penetrates into the base wafer to a depth of about .003″ and an emitter electrode about .015″ in diameter that penetrates about .001″ leaving a spacing of about .001″ separating the electrodes in the base wafer. While some improvement is noted upon any increase in this 3 to 1 ratio between the collector and emitter penetrations, optimum results are achieved when the ratio is at least 9 to 1 or greater, i. e., the collector electrode penetrates at least 9 times as deeply into the wafer as does the emitter electrode.

An emitter electrode having minimum penetration may be formed not only according to the low temperature process heretofore described in connection with the preferred embodiment, but also by the use of a silver paste carrier technique as described in the copending application of J. I. Pankove, Serial No. 427,818, filed May 5, 1954, and assigned to the present assignee. Utilizing Pankove's technique, both the emitter and collector electrodes may be surface alloyed to a semi-conductor base wafer simultaneously and without the necessity of two separate firing steps. By means of any known jig an indium pellet about .045″ in diameter and about .002″ thick may be held in place on one surface of a base wafer and a quantity of silver paste comprising by weight about 98 parts powdered silver and about 2 parts powdered indium in a nitrocellulose binder may be applied to the opposite surface of the wafer. The silver paste may be applied by brushing or printing to any desired thickness such as about .001″. A base tab is placed upon the surface of the wafer adjacent to the silver paste and the assembly is heated at about 700° C. in a non-reducing atmosphere for about 5–10 minutes simultaneously to alloy the indium and the silver paste to the wafer and to solder the base tab to the wafer. As explained in the co-pending Pankove application, the silver paste alloys to a relatively small depth in the wafer, and acts as a carrier for the indium to control its depth of penetration.

The instant invention is not limited to devices constructed of the specific materials or by the specific methods heretofore described. Devices according to the invention may include bases of p-type as well as of n-type semi-conductive material, and of other material than germanium such as, for example, silicon. Generally transistor base wafers are of one conductivity type, p or n, and electrodes surface alloyed to the wafers comprise impurities capable of imparting the opposite type conductivity, n or p, respectively, to the base wafer materials when dispersed therein. The conductivity types of the recrystallized regions are controlled by the electrode impurities and are of opposite type from the base region. For example, indium, a p-type impurity, is commonly used as an electrode material on n-type semi-conductive germanium and silicon. Antimony, an n-type impurity, is commonly used as an electrode material on p-type wafers. Any of the impurity materials may be dissolved in a carrier, a material useful for its metallurgical properties but having substantially no effect upon the conductivity characteristics of the semi-conductor. These considerations are common to the alloy type transistor art and are not necessarily limitations of the instant invention. Other types of rectifying electrodes such as surface barrier and grown junction electrodes may be included in devices according to the invention.

An important feature of the instant invention relates to the relative locations of the emitter and collector barriers of a transistor with respect to the surfaces of the base wafer of the transistor. Devices according to the invention comprise relatively flat, cuboidal wafers of substantial thickness and good physical strength. One electrode, particularly adapted for operation in a circuit as a collector is relatively large and is alloyed deeply into one surface of the wafer. A second electrode, adapted to be operated as an emitter, is disposed upon the opposite surface of the wafer and penetrates into the wafer only to the minimum depth required to provide adequate charge carrier injection ability.

What is claimed is:

1. A transistor device comprising a crystalline semiconductive base wafer, an emitter electrode disposed upon one surface of said wafer and forming a first rectifying barrier in said wafer adjacent to said surface, and a collector electrode disposed upon a second surface of said wafer opposite said one surface and forming a second rectifying barrier in said wafer adjacent to said second surface, said second barrier being of greater area than said first barrier, the ratio of the maximum depth of penetration of said second barrier beneath the plane of said second surface to the maximum depth of penetration of said first barrier beneath the plane of said first surface being greater than the ratio of the respective areas of said two barriers.

2. A transistor device comprising a crystalline semiconductive base wafer, an emitter electrode disposed upon one surface of said wafer and forming a first rectifying barrier in said wafer adjacent to said surface, and a collector electrode disposed upon a second surface of said wafer opposite said one surface, said collector electrode contacting a larger surface portion of said wafer than said emitter electrode and forming a second rectifying barrier in said wafer adjacent to said second surface, the maximum depth of said second barrier beneath the plane of said second surface being more than nine times the maximum depth of said first barrier beneath the plane of said first surface.

3. A transistor device comprising a crystalline semiconductive base wafer, an emitter electrode disposed upon one surface of said wafer and forming a first rectifying barrier in said wafer adjacent to said surface, and a collector electrode disposed upon a second surface of said wafer opposite said one surface, said collector electrode contacting a surface portion of said wafer about nine times larger than the surface portion contacted by said emitter electrode, and said collector electrode forming a second rectifying barrier in said wafer adjacent to said second surface, the maximum depth of said second barrier beneath the plane of said second surface being more than nine times the maximum depth of said first barrier beneath the plane of said first surface.

4. A transistor device comprising a crystalline semiconductive base wafer, an emitter electrode disposed upon a portion of one surface of said wafer and forming a first rectifying barrier in said wafer, said barrier being substantially parallel to said surface over its entire area, and a collector electrode disposed upon a second surface of said wafer opposite said one surface, said collector electrode contacting a larger surface portion of said wafer than said emitter electrode and forming a rectifying barrier in said wafer adjacent to said second surface, the maximum depth of said second barrier beneath the plane of said second surface being more than nine times the maximum depth of said first barrier beneath the plane of said first surface.

5. A transistor device comprising a crystalline semiconductive base wafer about .004" to .005" thick, an emitter electrode disposed upon one surface of said wafer and forming a first rectifying barrier in said wafer, all of said barrier lying within less than about 10$\mu$ of the plane of said one surface, and a collector electrode disposed upon a second surface of said wafer opposite said one surface and forming a second rectifying barrier in said wafer, said second barrier being coaxially aligned with said first barrier and approaching said first barrier to within about .001".

6. A transistor device comprising a substantially cuboidal, n-type semi-conductive germanium base wafer, a large area emitter electrode disposed upon one surface of said wafer and electrically separated from said wafer by a rectifying barrier, the entire surface of said barrier lying within less than 10$\mu$ of the plane of said surface, and a collector electrode disposed upon a second surface of said wafer opposite said one surface and electrically separated from said wafer by a second rectifying barrier, said second rectifying barrier being of larger area than said first barrier and constituting a p–n rectifying junction coaxially aligned with said first barrier and approaching said first barrier to within about .001".

References Cited in the file of this patent

UNITED STATES PATENTS

| | | |
|---|---|---|
| 2,563,503 | Wallace | Aug. 7, 1951 |
| 2,697,052 | Dacey | Dec. 14, 1954 |
| 2,725,505 | Webster et al. | Nov. 29, 1955 |
| 2,743,693 | Schafer | May 1, 1956 |
| 2,748,325 | Jenny | May 29, 1956 |
| 2,750,542 | Armstrong et al. | June 12, 1956 |

OTHER REFERENCES

Mueller: R. C. A. Review, December 1953, vol. XIV, No. 4, pages 586–594.